United States Patent
Chen et al.

(10) Patent No.: US 9,401,417 B2
(45) Date of Patent: Jul. 26, 2016

(54) METHOD OF MANUFACTURING A SEMICONDUCTOR DEVICE

(71) Applicant: UNITED MICROELECTRONICS CORP., Hsin-Chu (TW)

(72) Inventors: Yi-Wei Chen, Taichung (TW); Chien-Chung Huang, Taichung (TW); Kok Seen Lew, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/726,595

(22) Filed: May 31, 2015

(65) Prior Publication Data

US 2015/0263137 A1    Sep. 17, 2015

Related U.S. Application Data

(62) Division of application No. 13/737,949, filed on Jan. 10, 2013, now Pat. No. 9,076,759.

(51) Int. Cl.
| | |
|---|---|
| *H01L 21/44* | (2006.01) |
| *H01L 29/66* | (2006.01) |
| *H01L 29/40* | (2006.01) |
| *H01L 29/45* | (2006.01) |
| *H01L 21/265* | (2006.01) |
| *H01L 21/285* | (2006.01) |
| *H01L 29/417* | (2006.01) |
| *H01L 29/78* | (2006.01) |
| *H01L 21/768* | (2006.01) |
| *H01L 29/08* | (2006.01) |
| *H01L 29/423* | (2006.01) |
| *H01L 23/485* | (2006.01) |

(52) U.S. Cl.
CPC .... *H01L 29/66795* (2013.01); *H01L 21/26506* (2013.01); *H01L 21/28518* (2013.01); *H01L 21/76831* (2013.01); *H01L 21/76843* (2013.01); *H01L 21/76855* (2013.01); *H01L 29/0847* (2013.01); *H01L 29/401* (2013.01); *H01L 29/41766* (2013.01); *H01L 29/41791* (2013.01); *H01L 29/4232* (2013.01); *H01L 29/45* (2013.01); *H01L 29/456* (2013.01); *H01L 29/665* (2013.01); *H01L 29/66553* (2013.01); *H01L 29/785* (2013.01); *H01L 23/485* (2013.01); *H01L 29/6656* (2013.01); *H01L 29/66545* (2013.01); *H01L 29/66628* (2013.01); *H01L 29/66636* (2013.01); *H01L 2924/0002* (2013.01)

(58) Field of Classification Search
CPC ............ H01L 29/665; H01L 21/26506; H01L 29/66795; H01L 29/0847
USPC .......................................... 438/682; 257/288
See application file for complete search history.

(56) References Cited

U.S. PATENT DOCUMENTS

| | | | |
|---|---|---|---|
| 5,998,873 A | 12/1999 | Blair | |
| 7,214,620 B2 | 5/2007 | Kim | |
| 2004/0192026 A1 | 9/2004 | Chen | |
| 2006/0170058 A1* | 8/2006 | Chiang | ............... H01L 21/0212 257/369 |

(Continued)

*Primary Examiner* — Theresa T Doan
(74) *Attorney, Agent, or Firm* — Winston Hsu; Scott Margo

(57) ABSTRACT

A method of manufacturing a semiconductor device includes forming an epitaxial layer within a source/drain region of a semiconductor substrate, forming a fluorine-containing layer on the surface of the epitaxial layer, forming a metal gate structure within the gate region after the step of forming the fluorine-containing layer, forming an interlayer dielectric to cover the semiconductor substrate, the epitaxial layer and the metal gate structure, forming a contact hole penetrating the interlayer dielectric to expose a portion of the epitaxial layer, forming a metal silicide layer on or in the epitaxial layer on a bottom of the contact hole so that the fluorine-containing layer is disposed on the periphery of the metal silicide layer.

14 Claims, 8 Drawing Sheets

(56) References Cited

U.S. PATENT DOCUMENTS

| | | | |
|---|---|---|---|
| 2007/0057312 A1* | 3/2007 | Kim | H01L 27/10823 257/315 |
| 2007/0200179 A1* | 8/2007 | Chen | H01L 21/823807 257/369 |
| 2008/0299720 A1 | 12/2008 | Carruthers | |
| 2010/0040768 A1 | 2/2010 | Dhindsa | |

* cited by examiner

METHOD OF MANUFACTURING A SEMICONDUCTOR DEVICE

CROSS REFERENCE TO RELATED APPLICATIONS

This application is a division of U.S. application Ser. No. 13/737,949, filed Jan. 10, 2013, the disclosure of which is hereby incorporated herein by reference in its entirety.

BACKGROUND OF THE INVENTION

1. Field of the Invention

The present invention generally relates to the field of semiconductor devices, and more particularly, to a method of manufacturing a semiconductor device in which a fluorine-containing layer is formed within a source/drain region.

2. Description of the Prior Art

As semiconductor processes advance to very deep sub-micron geometries, such as 20-nm node and beyond, and with the progress of device miniaturization, junction resistance between semiconductors and external contacts has become a critical issue; therefore, there is a strong need to invent a semiconductor device with relatively low junction resistance.

In a conventional method for manufacturing a contact, in order to reduce resistance, a self-aligned silicide (salicide) process is utilized to form a metal silicide layer on the junction between a metal contact and an active area. For example, a semiconductor substrate having at least a semiconductor device, such as a metal-oxide-semiconductor field effect transistor (MOSFET), is provided. Then, at least a metal film is disposed conformally along the entire surface of the semiconductor device so that at least a portion of the metal film can contact with source/drain regions of the semiconductor device directly. In a next step, a first anneal process is carried out to diffuse metal elements from the metal film into the source/drain regions or to pull up silicon element from the source/drain regions and a metal silicide layer is therefore formed on the surface of the source/drain regions. Then, remaining metal film is removed followed by performing a second anneal process. During this second anneal process, the resistivity of the metal silicide layers can be further reduced. Subsequently, an interlayer dielectric (ILD) having a plurality of contact holes is formed to cover the semiconductor device. The contact holes may expose a portion of the source/drain regions from the ILD. Finally, a barrier layer and a conductive layer are deposited inside the contact holes to thereby complete a semiconductor device with metal silicide contact structure. During the above-saying procedures where metal elements diffuse into source/region regions, however, metal elements inside the metal silicide layers may often not only diffuse into the interface between the metal film and the semiconductor substrate but also laterally diffuse into a region under a gate structure. Defects caused by this phenomenon include piping defects, spike defects or the like, which may incur unwanted current leakage and no doubt decrease the reliability of the semiconductor device.

Regarding the drawbacks described above, there is always a continuing need to develop a semiconductor device and a manufacturing method of the same, which has relatively high reliability and may overcome current leakage problems resulting from piping defects.

SUMMARY OF THE INVENTION

It is therefore an objective of the present invention to provide a method of manufacturing a semiconductor device, which is able to solve the drawbacks in the above-mentioned conventional semiconductor devices.

According to one embodiment of the present invention, a method of manufacturing a semiconductor device is disclosed. At the beginning of the method, a semiconductor substrate having at least a gate region and at least a source/drain region adjoining the gate region is provided. Then, at least an epitaxial layer is formed on the semiconductor substrate within the source/drain region followed by forming a fluorine-containing layer on the surface of the epitaxial layer or in the epitaxial layer. After the step of forming the fluorine-containing layer, a metal gate structure is formed within the gate region. In a next step, an interlayer dielectric is formed to completely cover the semiconductor substrate, the epitaxial layer and the metal gate structure. Subsequently, at least a contact hole penetrating the interlayer dielectric is formed to expose a portion of the epitaxial layer. Finally, at least a metal silicide layer is formed in the epitaxial layer on the bottom of the contact hole, and the fluorine-containing layer is located around the sides of the metal silicide layer when the metal silicide layer is formed.

These and other objectives of the present invention will no doubt become obvious to those of ordinary skill in the art after reading the following detailed description of the preferred embodiment that is illustrated in the various figures and drawings.

Figure 1:
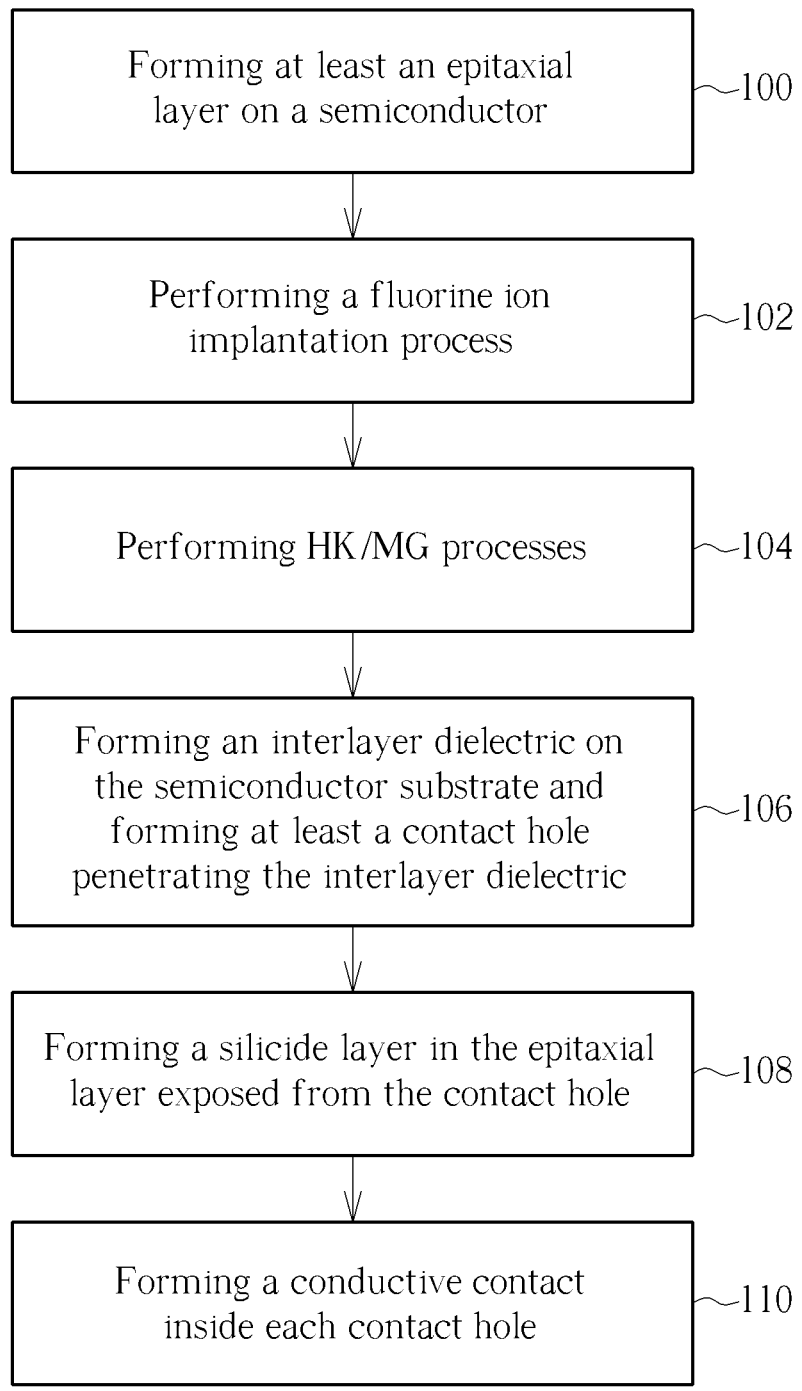
FIG. 1 is a simplified flowchart showing processes for forming a semiconductor device according to a first preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 2:
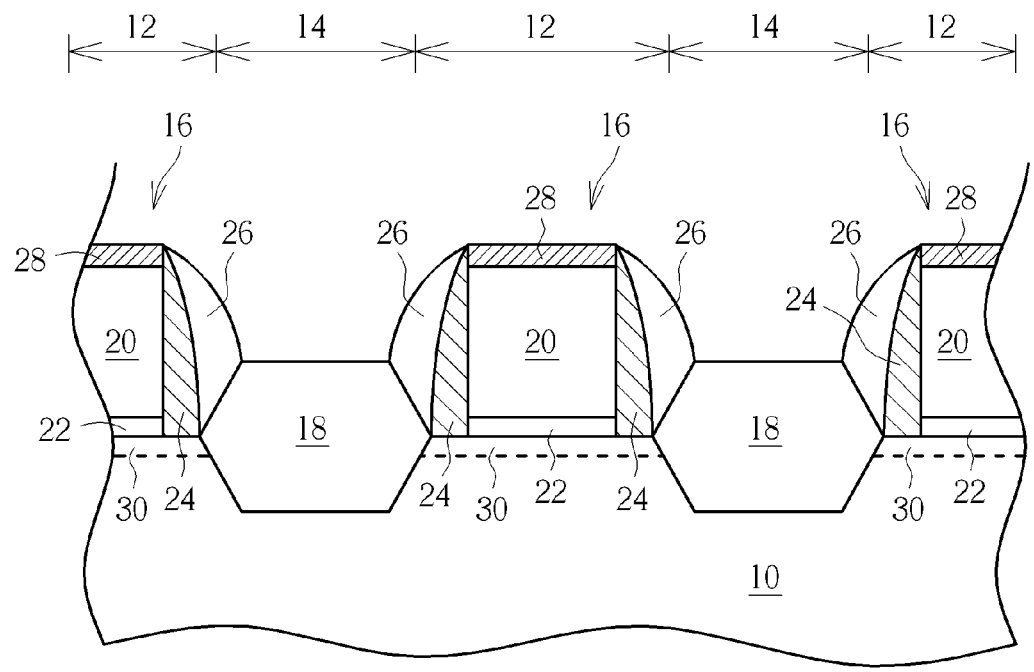
FIG. 2 is a schematic, cross-sectional diagram showing a structure where an epitaxial layer is formed at a side of a dummy gate structure according to the first preferred embodiment of the present invention.

The embodiments of the present invention will be described in detail with reference to the drawings. Here, structure of a semiconductor device and a manufacturing method of the same will be described. Please refer to FIG. 1 and FIG. 2. FIG. 1 is a simplified flow chart showing processes for forming a semiconductor device according to a first preferred embodiment of the present invention. FIG. 2 is a schematic, cross-sectional diagram showing a method for manufacturing the semiconductor device according to a first preferred embodiment of the present invention. As shown in FIG. 2, a semiconductor substrate 10 is provided, which is defined with at least two regions, i.e. at least a gate region 12 and at least a source/drain region 14. The semiconductor substrate 10 includes a silicon substrate, a silicon-on-insulator (SOI) substrate or the like, but is not limited thereto. A gate structure 16 is formed on the semiconductor substrate 10 within the gate region 12, which includes a gate layer 20, a mask layer 28, a dielectric layer 22, a first spacer 24 and a second spacer 26. Specifically, the gate layer 20 may include semiconductor material, like undoped polysilicon, polysilicon having N-type or P-type dopants or amorphous polysilicon. It is worth noting that, according to embodiments of the present invention, the gate structure 16 disclosed herein is preferably a dummy gate structure and the gate layer is preferably a dummy layer. That is to say, the dummy layer may be replaced with metal or other material with high electrical conductivity in the following processes, but is not limited to this. The mask layer 28, such as $SiO_2$, SiN, SiC, or SiON, is atop the gate layer 20 and is used to define a position of the gate layer 20. The dielectric layer 22 is disposed between the gate layer 20 and the semiconductor substrate 10. In this preferred embodiment, the dielectric layer 22 is preferably selected from the groups consisting of high-K dielectric material. That is to say, in this case, the gate structure 16 is fabricated through a high-K first procedure. However, in another case where a high-K last procedure is adopted, the dielectric layer 22 in this stage may still be a silicon oxide rather than high-K dielectric material. The above-described high-K dielectric material includes $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, strontium bismuth tantalate (SBT), lead zirconate titanate (PZT) or barium strontium titanate (BST), but is not limited thereto.

Still referring to FIG. 2 accompanied with FIG. 1, after a step 100 for forming an epitaxial layer 18 on a semiconductor substrate 10, at least an epitaxial layer 18 is formed at sides of the dummy gate structure 20. The purpose of the epitaxial layer 18 is used to apply required stress, such as tensile stress or compressive stress, to a certain region. By way of example, if the epitaxial layer 18 is formed in a PMOS region, the composition of the epitaxial layer 18 preferably includes a silicon germanium (SiGe) since it has a larger lattice constant than silicon (Si) constituting the semiconductor substrate 10. Through this way, the epitaxial layer 18 including SiGe is able to apply compressive stress to a channel region 30 located underneath the dielectric layer 22 within the PMOS region and therefore increase the carrier mobility in the channel region 30. For the sake of clarity, a process for forming the epitaxial layer 18 including SiGe is described in detail as follows. First, after the first spacer 24 is formed on the sidewall of the gate layer 20, at least a recess (not shown) is etched into the surface of the semiconductor substrate 10 through a proper etching process, such as a reactive ion etch (RIE) process and so forth. Therefore, the recess with predetermined length and/or width and/or depth is formed at a side of the gate layer 20. In a next step, an epitaxial growth process, such as a co-flow epitaxial growth process, a cyclic selective epitaxial growth process or the like, may be carried out in order to grow an epitaxial SiGe in each corresponding recess. It should be noted that, when the process for forming the epitaxial SiGe is completed, the top surface of the epitaxial layer 18 is usually higher than the surface of the semiconductor substrate 10. In addition, in order to meet specific product requirement, the epitaxial layer 18 including SiGe may optionally include other suitable epitaxial layers or elements, but not limits thereto. For example, the epitaxial layer 18 may include epitaxial Si, at least a layer of epitaxial SiGe with a relatively low concentration of Ge, at least a layer of epitaxial SiGe with a relatively high concentration of Ge, an epitaxial Si layer and so forth, which are disposed sequentially from bottom to up. In addition, the epitaxial layer 18 may contain boron (B), which is grown at a temperature from about 600° C. to 800° C. by using dichlorosilane ($Si_2H_2Cl_2$), diborane ($B_2H_6$), hydrogen chloride (HCl), hydrogen ($H_2$), etc. as gas species.

After the epitaxial layer 18 is formed at the side of the gate layer 20, the second spacer 26 may be formed optionally in order to expose a portion of the epitaxial layer 18. In a subsequent process, the exposed epitaxial layer 18 may be doped with proper dopants so that a diffusion region (not shown) may be formed on the surface of the exposed epitaxial layer 18. In this embodiment, the diffusion region is regarded as a source/drain within the source/drain region 14 of the PMOS device. That is to say, the diffusion region is mainly located inside the epitaxial layer 18 according to this embodiment. However, according to another embodiment, the diffusion region may mainly locate in the semiconductor substrate 10 rather than inside the epitaxial layer 18 if the time of forming the diffusion region is prior to the time of growing the epitaxial layer 18. To put it more concretely, a suitable implantation processes may be carried out before the formation of the recess and before the growth of the epitaxial layer 18. In this way, the diffusion region may mainly locate in the semiconductor substrate 10 and may surround a lower portion of the epitaxial layer 18. It should be noted that, in order to minimize short channel effects (SCEs), an extension diffusion region extending from each diffusion region to the bottom of the first spacer 24 may be also formed, but is not limited thereto.

In the first preferred embodiment, a two-layered spacer, i.e. the first spacer 24 and the second spacer 26, is formed on the sidewall of the gate layer 20. However, it is worth noting that the spacer with two-layered structure is only one of the feasible embodiments and shall by no means restrict the present invention. That is to say, the two-layered spacer may be replaced with a multi-layered spacer or a single-layered spacer according to various requirements.

Figure 3:
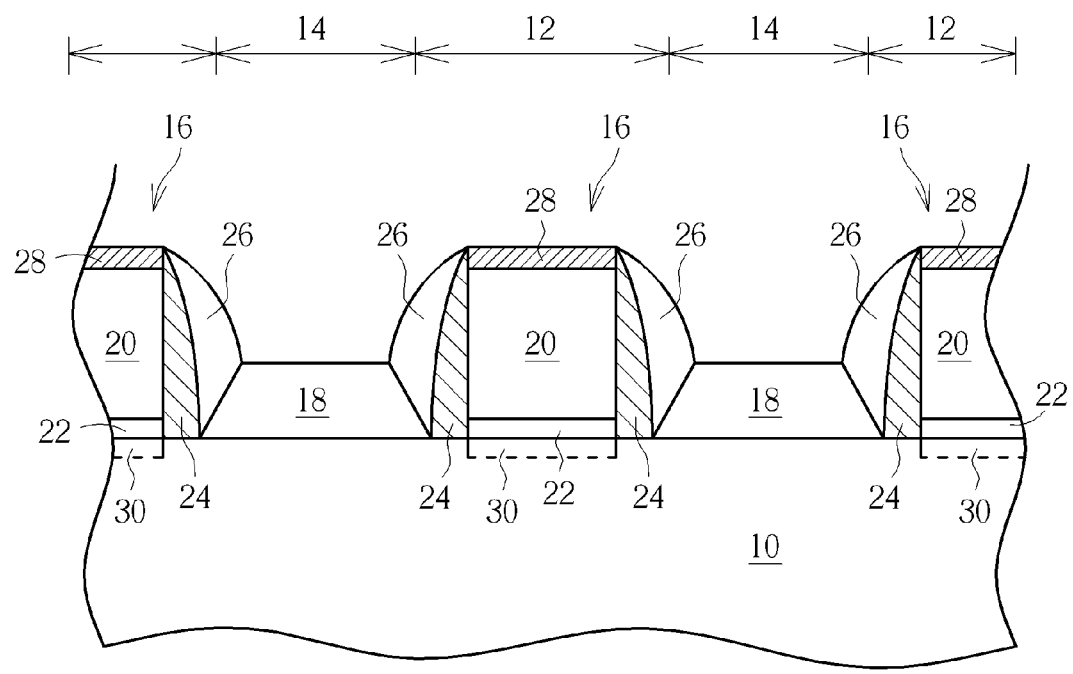
FIG. 3 is a schematic, cross-sectional diagram showing a structure where an epitaxial layer is formed at a side of a dummy gate structure according to the first preferred embodiment of the present invention.

Please refer to FIG. 3. FIG. 3 is a schematic, cross-sectional diagram showing a method of manufacturing the semiconductor device according to the first preferred embodiment of the present invention. The difference between the structure shown in FIG. 2 and that shown in FIG. 3 is that the composition of an epitaxial layer 18 shown in FIG. 3 preferably includes material having a smaller lattice constant than silicon (Si) constituting the semiconductor substrate 10. In this case, epitaxial layer 18 is able to apply a tensile stress to the channel region 30 underneath the dielectric layer 22. In other words, the epitaxial layer 18 shown in FIG. 3 is preferably applied in an NMOS device. By way of example, the composition of the epitaxial layer 18 may include silicon phosphorous (SiP), silicon carbon (SiC), phosphorus-doped silicon carbon or the like. It should be noted that the epitaxial layer 18 may be doped with other suitable elements through in-situ growth process or implantation processes, but is not limited thereto. In one case, when the composition of the epitaxial layer 18 includes carbon-free SiP, the epitaxial layer 18 may preferably be grown on the semiconductor substrate 10 through cyclic or co-flow selective epitaxial growth processes. During these cyclic or co-flow selective epitaxial growth processes, source gases and etching gases may be applied to the semiconductor substrate 10 alternately and repeatedly at least two times so that the epitaxial layers 18 can only grow on the semiconductor substrate 10 at the sides of the gate structure 16 rather than directly on the gate structure 16. As the structure shown in FIG. 3, the epitaxial layer 18 is atop the surface of the semiconductor substrate 10 and located between the two adjacent gate structures 16. It is worth noting that, if there is already a recess (not shown) etched into the semiconductor substrate 10 at each side of gate structure 16 before the epitaxial layer 18 is formed, the epitaxial layer 18 may therefore fill up each recess and level with the surface of the semiconductor substrate 10 after the corresponding epitaxial growth processes. The source gases applied in the above-mentioned processes may include silicon sources, such as dichlorosilane ($SiH_2Cl_2$), silane ($SiH_4$), disilane ($Si_2H_6$) and the like, and phosphorus sources, such as phosphine ($PH_3$) and the like. The etching gases may include hydrogen chloride (HCl) gas, a chlorine gas and the like.

Figure 4:
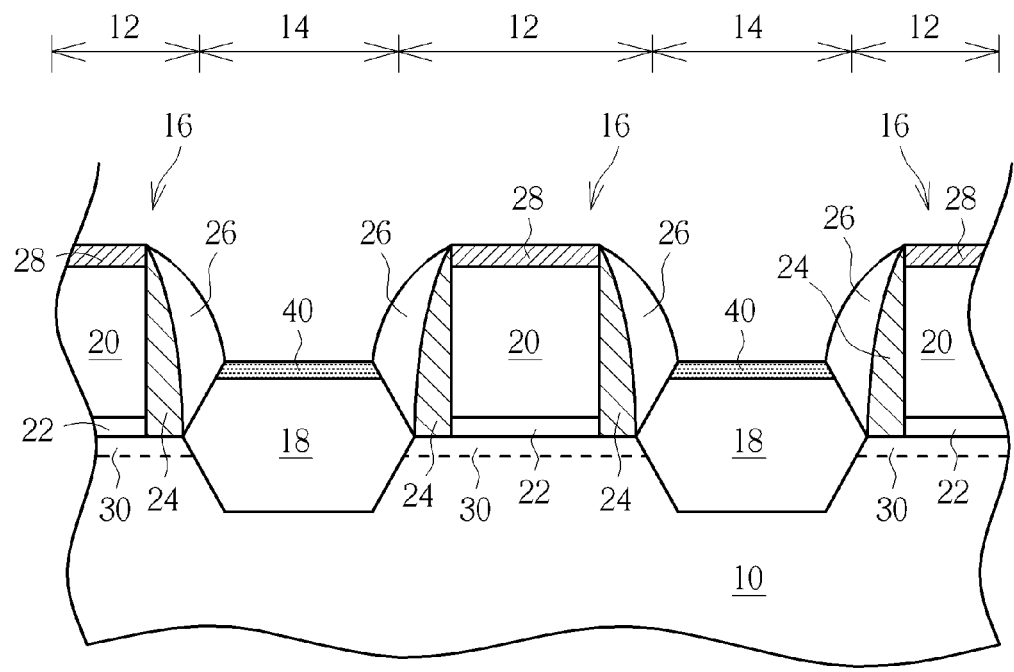
FIG. 4 is a schematic, cross-sectional diagram showing a structure having a fluorine containing layers on the surface of an epitaxial layer according to the first preferred embodiment of the present invention.

Please refer to FIG. 4 and refer back to FIG. 1. FIG. 4 is a schematic, cross-sectional diagram showing a structure having a fluorine-containing layer on the surface of an epitaxial layer after step 102. In step 102, at least a fluorine ion implantation process is carried out so that a fluorine-containing layer may be formed on the surface of an epitaxial layer. It should be noted that, a structure shown in FIG. 4 is corresponding to the structure shown in FIG. 2 so that the epitaxial layer 18 preferably includes SiGe. However, without departing from the spirit and scope of the present invention, a structure shown in FIG. 4 may be modified properly so it may be corresponding to the structure shown in FIG. 3. Please refer to FIG. 4. In this stage, a fluorine-containing layer 40 is formed on the surface of a portion of the epitaxial layer 18 through a fluorine ion implantation process. Preferably, the fluorine-containing layer 40 is distributed along the surface of the epitaxial layer 18.

After the fluorine ion implantation process is completed, a buffer layer, such as silicon oxide layer, and an etch stop film, such as silicon nitride, may be formed sequentially in order to conformally cover the gate electrodes 16 and the epitaxial layers 18. Then, a dielectric layer (not shown) is formed to cover the semiconductor substrate 10. The dielectric layer may be a silicon oxide layer (TEOS film, PSG film, BPSG film, SOG film or the like) formed by CVD or the like. After the formation of the dielectric layer, a planarizing process, such as a chemical mechanical polishing (CMP) process is then performed to partially remove the dielectric layer, the etch stop film, the buffer layer and the mask layer 28 until the top surface of the gate layer 20 is exposed. Subsequently, step 104 may be carried out in order to form a high-K/metal gate (HK/MG) structure. That is to say, an etching process is performed to remove the gate layer 20 from the gate structure 16 to form a gate trench (not shown). It should be noted that, if the gate structure 16 described here is not a dummy gate structure, the gate layer 20 will remains during the following manufacturing processes. It also should be noted that, if the dielectric layer 22 described above has a dielectric constant less than or equal to that of $SiO_2$ or SiN, preferably, a high-K dielectric layer may be conformally formed on the dielectric layer 22 and located on the sidewalls and bottom of the gate trench. The high-K dielectric material includes $HfO_2$, $HfSiO_4$, HfSiON, $Al_2O_3$, $La_2O_3$, $Ta_2O_5$, $Y_2O_3$, $ZrO_2$, $SrTiO_3$, $ZrSiO_4$, $HfZrO_4$, strontium bismuth tantalate (SBT), lead zirconate titanate (PZT) or barium strontium titanate (BST). Finally, a metal layer (not shown) may fill up the gate trench to thereby form a metal gate structure. It should be noted that several layers may exist between the metal layer and the dielectric layer 22, such as a work function metal layer, a barrier layer or an adhesive layer, if required, but is not limited thereto. The metal layer is preferably selected from a group consisting of a single metal Al, Ti, Ta, W, Nb, Mo, Cu, TiN, TiC, TaN, TiW, and composite metal such as Ti/TiN, but not limited thereto.

Figure 5:
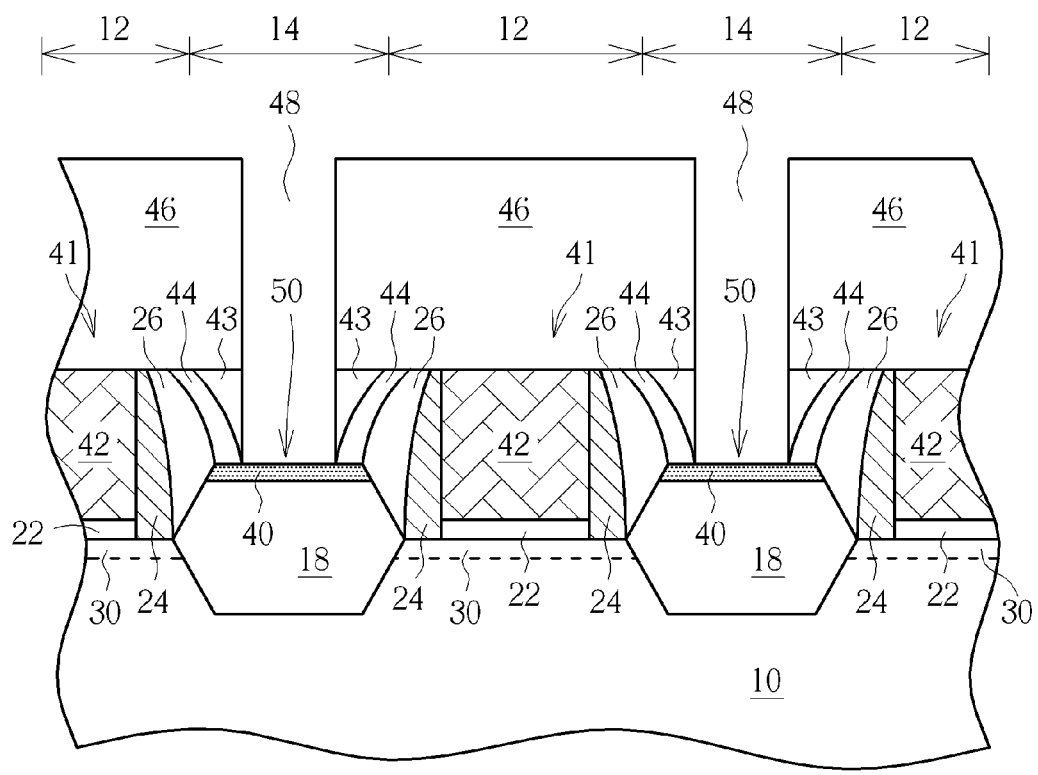
FIG. 5 is a schematic, cross-sectional diagram showing a semiconductor substrate covered with an interlayer dielectric having a plurality of contact holes according to the first preferred embodiment of the present invention.

Please refer to FIG. 5 and FIG. 1. FIG. 5 is a schematic, cross-sectional diagram showing a semiconductor substrate covered with an interlayer dielectric (ILD) having a plurality of contact holes according to the first preferred embodiment of the present invention. As shown in FIG. 1, after step 104 is completed, step 106 is then carried out in order to form an ILD having a plurality of contact holes and covering the HK/MG structure. The structure after step 106 is shown in FIG. 5. Processes for manufacturing the structure in FIG. 5 are described in detail as follows. First, a structure having the metal gate structures 41, the buffer oxide (not shown), the etch stop film 44 and the dielectric layer 43 is provided. Each metal gate structure 41 include at least the metal layer 42, the dielectric layer 22, optional high-K dielectric layer, the first spacer 24 and the second spacer 26, but is not limited to this. Then, an ILD 46 is formed to cover the dielectric layer 43 and the metal gate structure 41 completely. Subsequently, an optional planarizing process, such as a chemical mechanical polishing (CMP) process or an etch-back process is performed to planarize the ILD 46. Finally, at least a contact hole 48 is formed inside the ILD 46. In this case, the contact hole 48 can penetrate the ILD 46, the dielectric layer 43, the etch stop film 44 and the buffer oxide sequentially and can reach the epitaxial layer 18. It is worth noting that, a certain extent of the epitaxial layer may be removed inevitably during an etching process of forming the above-mentioned contact hole 48. As a result, a portion of the fluorine-containing layer 40 on the surface of each epitaxial layer 18 is exposed from the contact holes 48. Additionally, each contact hole 48 may have an elliptical shape, a bar shape or a circular shape.

Figure 6:
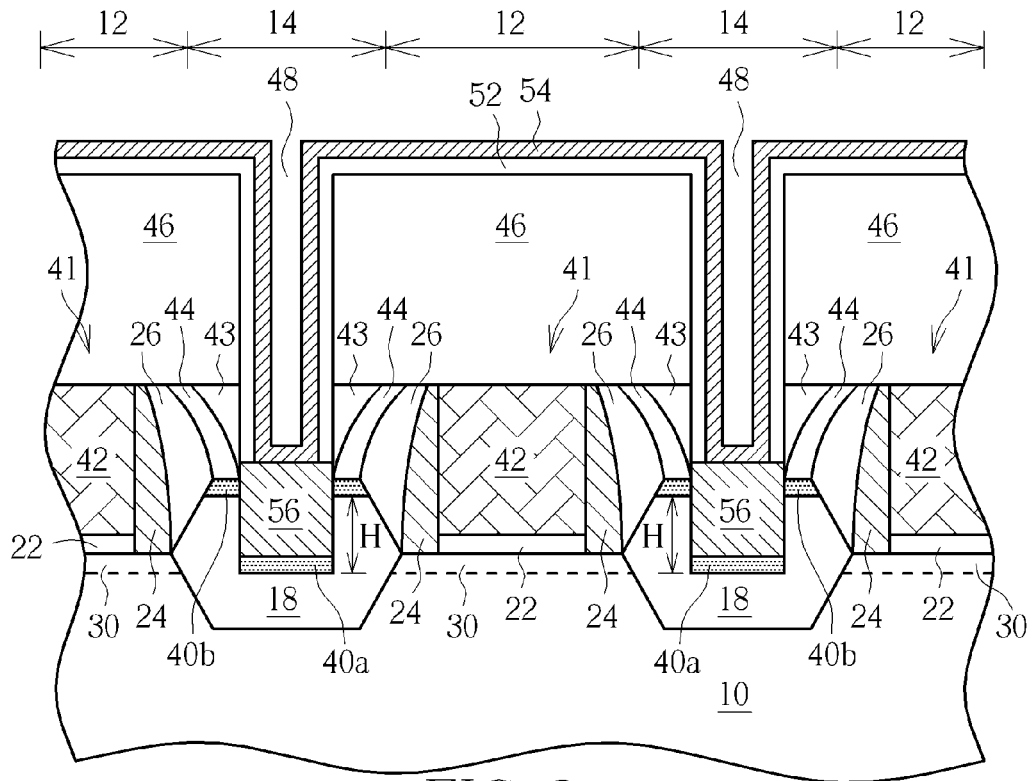
FIG. 6 is a schematic, cross-sectional diagram showing a structure where a metal silicide layer is formed inside each contact hole according to the first preferred embodiment of the present invention.

Please refer to FIG. 6 and FIG. 1. FIG. 6 is a schematic, cross-sectional diagram after step 108, which shows a structure where a metal contact is formed inside a contact hole according to the first preferred embodiment of the present invention. For the sake of clarity, processes for manufacturing the structure in FIG. 6 are described in detail as follows. First, a metal film 52 is formed conformally on the sidewalls and the bottom surface 50 of the contact hole 50. For example, the metal film 52 may be formed through a physical vapor deposition (PVD) process or a chemical vapor deposition (CVD) process. The composition of this metal film 52 may include nickel (Ni), cobalt (Co), titanium (Ti), platinum (Pt), tungsten (W) or the like. In this embodiment, the metal film 52 is preferably selected from Ni (Pt) due to its outstanding advantages over other metals, such as lower reaction temperature for silicide formation, less Si consumption, lower specific resistivity and smaller contact resistance. Then, a first anneal at a temperature from about 200 °C. to about 700 °C. is performed to diffuse the metal elements inside the metal film 52 into the underneath epitaxial layer 18. As a result, a metal silicide layer 56, like nickel silicide (NiSi) can be formed. Optionally, in order to further reduce the sheet resistance of the metal silicide layer 56, after the removal of the metal film 52, a second anneal may be performed in order to convert the high resistance nickel silicide or nickel rich silicide phase into the nickel silicide 56 of lower resistance. It should be noted that, before the first anneal process, a protective layer 54 may be formed on the surface of the metal film 52 to present the metal film 52 from oxidizing.

Still referring to FIG. 6, when the step of forming the metal silicide layer 56 is completed, a portion of the epitaxial layer 18 is occupied by a metal silicide layer 56 and a top surface of the metal silicide layer 56 may be substantially higher than an original top surface of the epitaxial layer 18. It should be noted that, during the formation of the metal silicide layer 56, a portion of the fluorine-containing layer underneath the metal film 52 may be located inside the metal silicide layer 56 and/or be pushed downwardly to a relatively deep position. To put it more concretely, as shown in FIG. 6, if the fluorine-containing layer 40a is pushed downwardly during the formation of the metal silicide layer 56, there will be a height difference H between the fluorine-containing layer 40b around the sides of the metal silicide layer 56 and the fluorine-containing layer 40a under the bottom of the metal silicide layer 56. In addition, if a portion of the fluorine-containing layer 40 is etched away during the formation of the contact hole 48, there may be only the fluorine-containing layer 40b around the sides of the metal silicide layer 56 and no fluorine-containing layer 40a under the metal silicide layer 56.

Figure 7:
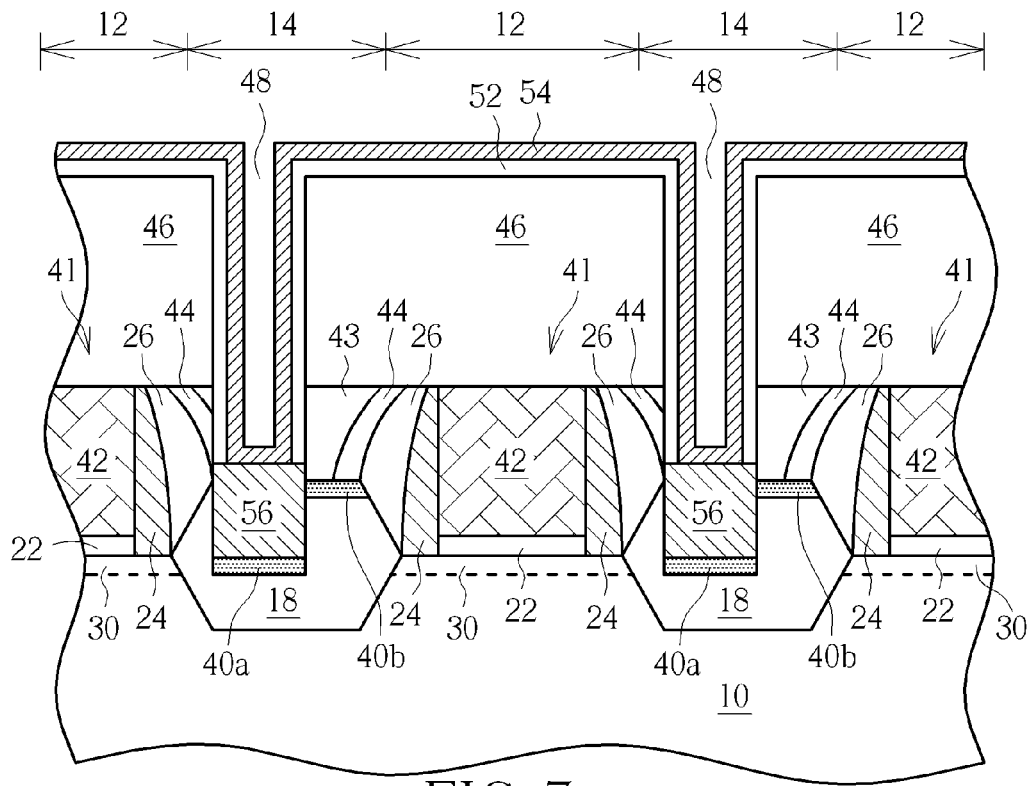
FIG. 7 is a schematic, cross-sectional diagram showing a structure where a metal silicide layer is formed inside each contact hole according to the first preferred embodiment of the present invention.

Furthermore, according to another preferred embodiment of the present invention, the present invention may also be applied to a structure where only a portion of the surface of each epitaxial layer is exposed from the corresponding contact hole. This structure is shown in FIG. 7. As shown in FIG. 7, each of the contact holes 48 is misaligned with the corresponding epitaxial layer 18 so that only a portion of the epitaxial layer 18 is exposed from each of the contact holes 48. As a result, after the formation of the metal silicide layer 56, the fluorine-containing layer 40b is not fully around the sides of the metal silicide layer 56 but only disposed on a periphery of the metal silicide layer 56. In other words, a portion of the fluorine-containing layer may exist on one side of the metal silicide layer 56 and a portion of the fluorine-containing layer may be inside and/or under the metal silicide layer 56 according to this preferred embodiment.

According to the embodiments shown in FIGS. 6 and 7, since fluorine elements can attach to defects in the epitaxial layer, they are able to amend defects in the epitaxial layer. In other words, one advantage of the present invention is that, due to the existence of the fluorine-containing layer, metal elements inside the metal film will no longer laterally diffuse into the channel region. As a result, the piping defects occurring in the conventional semiconductor devices will not present. Moreover, fluorine elements may further stabilize the metal silicide and present the agglomeration phenomenon.

Figure 8:
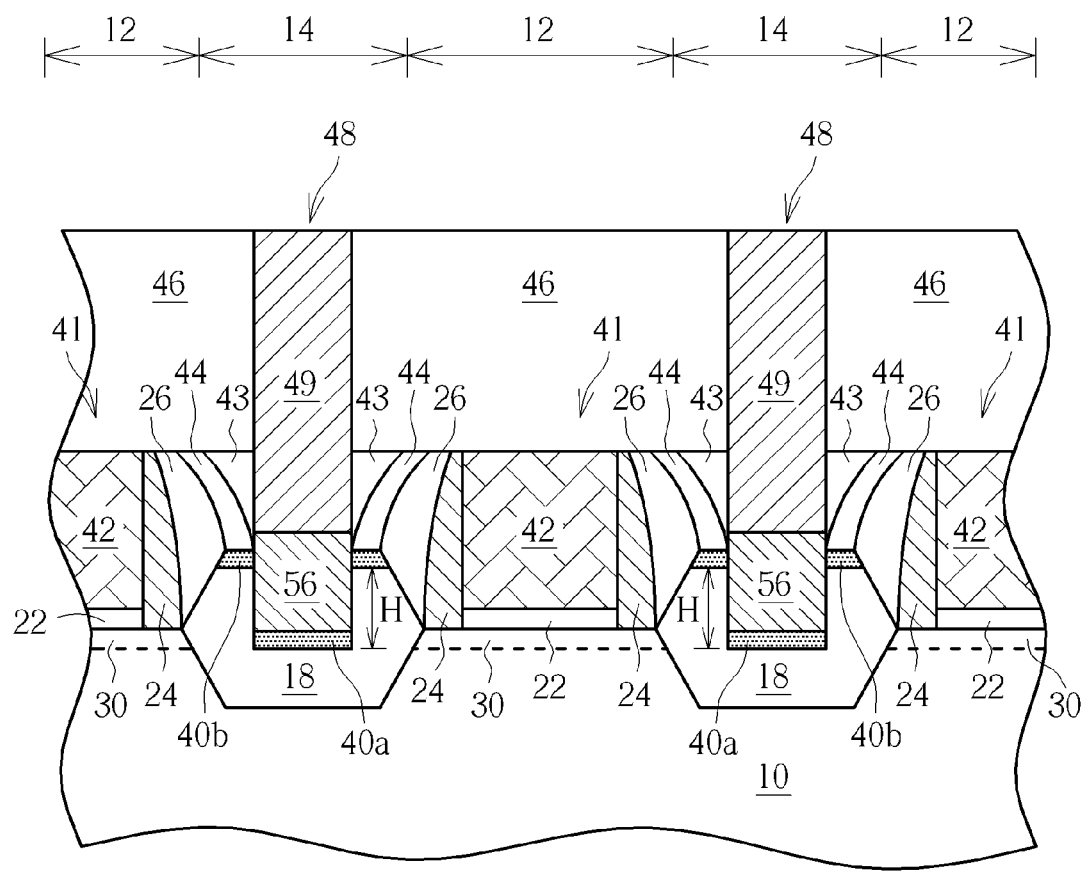
FIG. 8 is a schematic, cross-sectional diagram showing a structure where a conductive contact is formed inside each contact hole according to the first preferred embodiment of the present invention.

After step 108 is completed, step 110 is further carried out to form a conductive contact inside each contact hole. A semiconductor device including the conductive contact is shown in FIG. 8. For example, a conductive contact 49 with relatively high conductivity is formed in each of the contact holes 48 through at least a deposition process, such a CVD process, and a planarization process, such as a CMP process. Additionally, there may be other layers (not shown), such as barrier layers and/or adhesive layers, located on the surface of each of the contact holes 48. The conductive contact 49 may be a metal contact including tungsten, aluminum, titanium, tantalum, niobium, molybdenum, copper, alloys of above, or other suitable conductive material. Since the above processes are well-known to those skilled in the art, for the sake of clarity, the description of which are therefore omitted.

In the following paragraph, a second preferred embodiment of the present invention is disclosed and the description below is mainly focused on differences among the first embodiment and the second embodiment. In addition, like or similar features will usually be described with same reference numerals for ease of illustration and description thereof.

Figure 9:
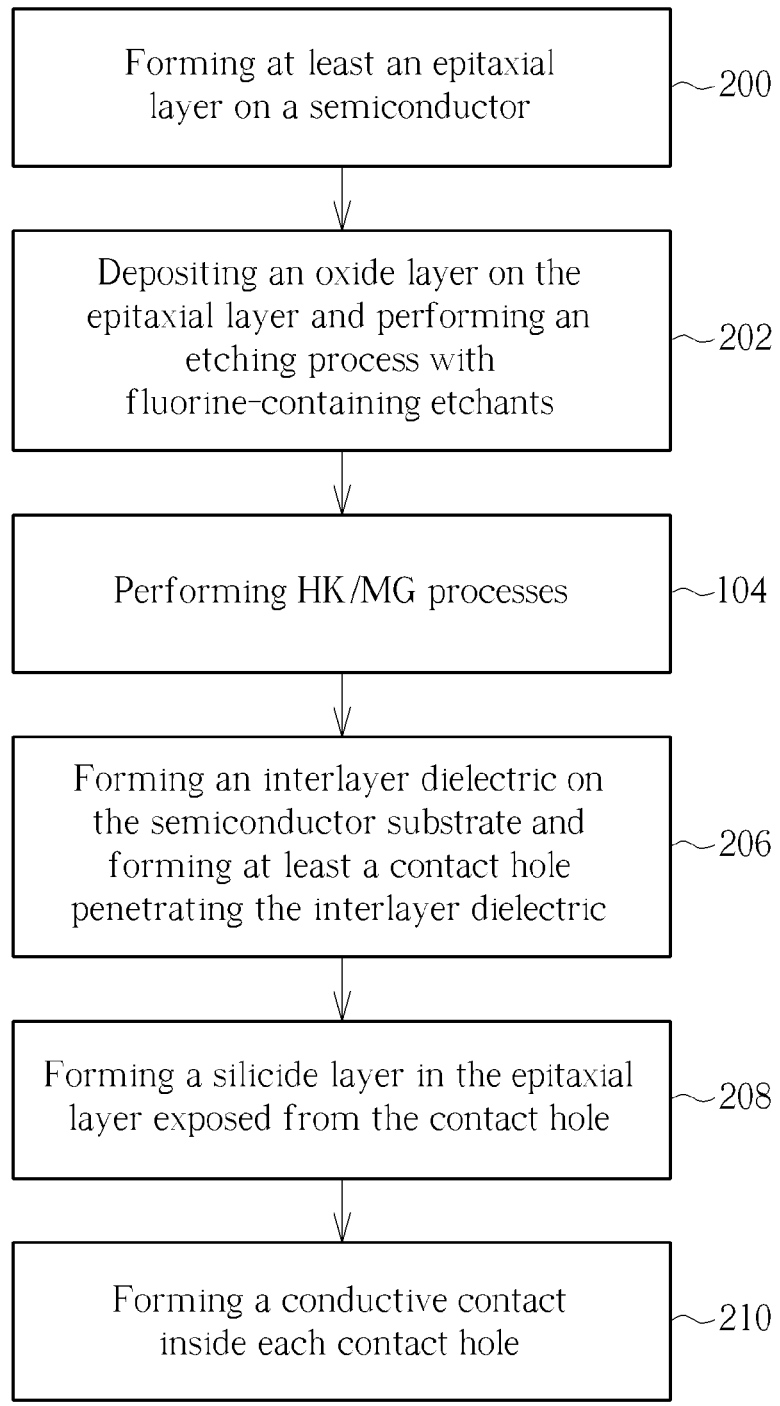
FIG. 9 is a simplified flowchart showing processes for forming a semiconductor device according to a second preferred embodiment of the present invention.
Figure 10:
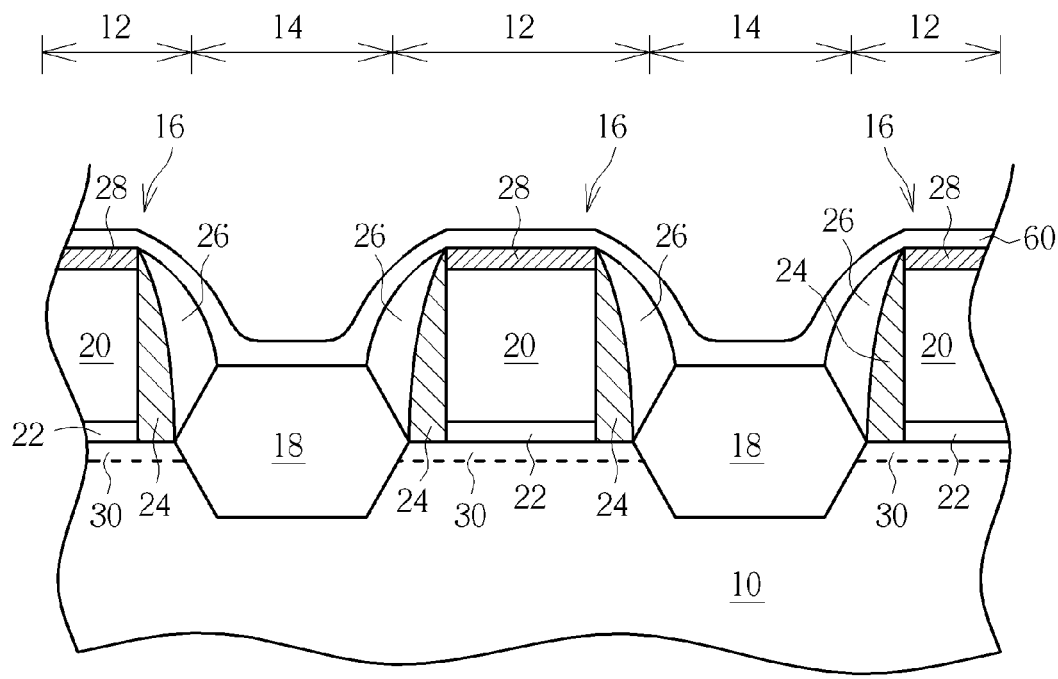
FIG. 10 is a schematic, cross-sectional diagram showing a structure where an oxide layer is formed to cover the surface of an epitaxial layer according to the second preferred embodiment of the present invention.
Figure 11:
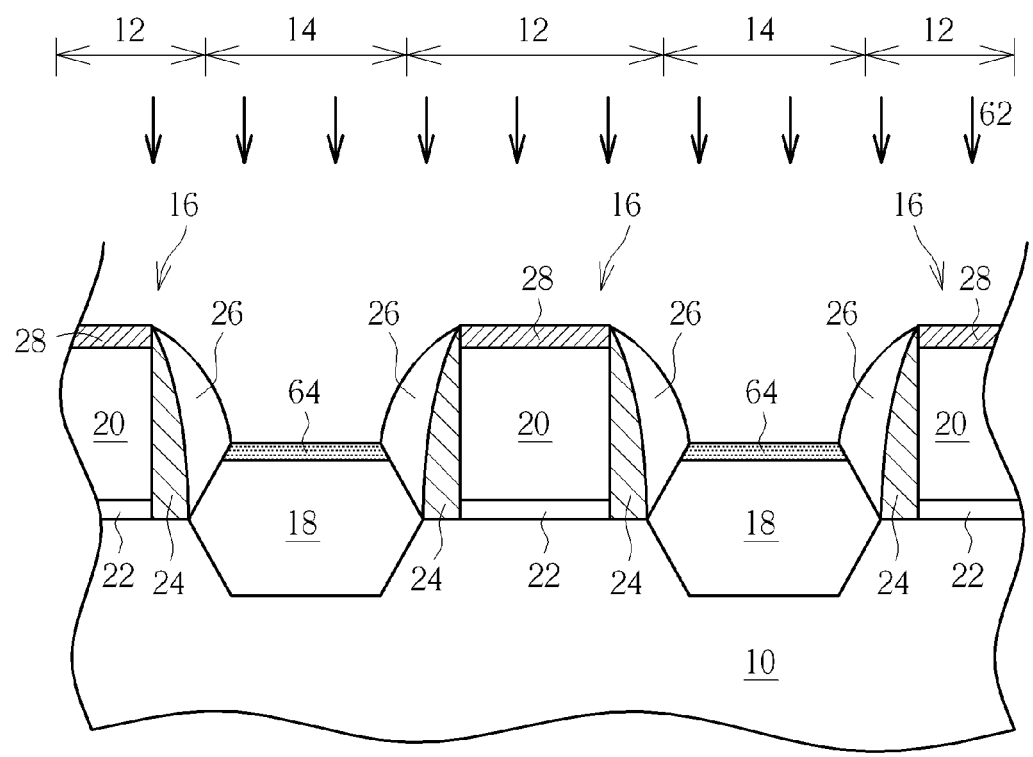
FIG. 11 is a schematic, cross-sectional diagram showing a structure having a fluorine containing layers on the surface of an epitaxial layer according to the second preferred embodiment of the present invention.

Please refer to FIG. 9. FIG. 9 is a simplified flow chart showing processes for forming a semiconductor device according to a second preferred embodiment of the present invention. First, step 200 shown in FIG. 9, similar to step 100 shown in FIG. 1, is carried out where a semiconductor substrate having an epitaxial layer is provided. Next, please refer to FIGS. 10 and 11 accompanied with FIG. 9. FIG. 10 is a schematic, cross-sectional diagram showing a structure where an oxide film is formed to cover the surface of an epitaxial layer according to the second preferred embodiment of the present invention. FIG. 11 is a schematic, cross-sectional diagram showing a structure having a fluorine containing layers on the surface of an epitaxial layer according to the second preferred embodiment of the present invention. In step 202, an oxide layer is formed on the epitaxial layer and an etching process with fluorine containing etchants is performed. The detailed description for performing these processes is described as follows. First, as shown in FIG. 10, a structure similar to that shown in FIG. 2 is provided. However, the structure shown in FIG. 10 further includes an oxide film 60 conformally covering the dummy gate structures 16 and the epitaxial layers 18. This oxide film 60 may be formed through a deposition process, such as CVD or other proper processes. The thickness of the oxide film 60 may preferably range from 3 nanometer (nm) to 5 nm, but is not limited to this. Additionally, according to another embodiment of the present invention, the oxide film may be formed through a thermal oxidation process instead of the above-mentioned deposition process. In this way, the oxide film may be formed only on the surface of the epitaxial layers 18 rather than on the surface of the gate structure 16.

In a next step, as shown in FIG. 11, an etching process 62 is performed to completely or partially remove the oxide film 60, wherein at least an etchant of the etching process is a fluorine-containing molecule, such as $NF_3$, $NH_4F$ or the like. It should be noted that, due to specific etching properties, a thin layer of fluorine-containing layer 64 may be formed only on the surface of the epitaxial layer 18 rather than on the gate structure 16. Subsequently, steps 204 and 206, similar to steps 104 and 106, are carried out in order to form a HK/MG structure and an ILD with a plurality of contact holes. Since these processes according to this embodiment are almost similar to that described in the first embodiment, for the sake of convenience and brevity, the detailed description for performing these similar processes are therefore omitted.

Figure 12:
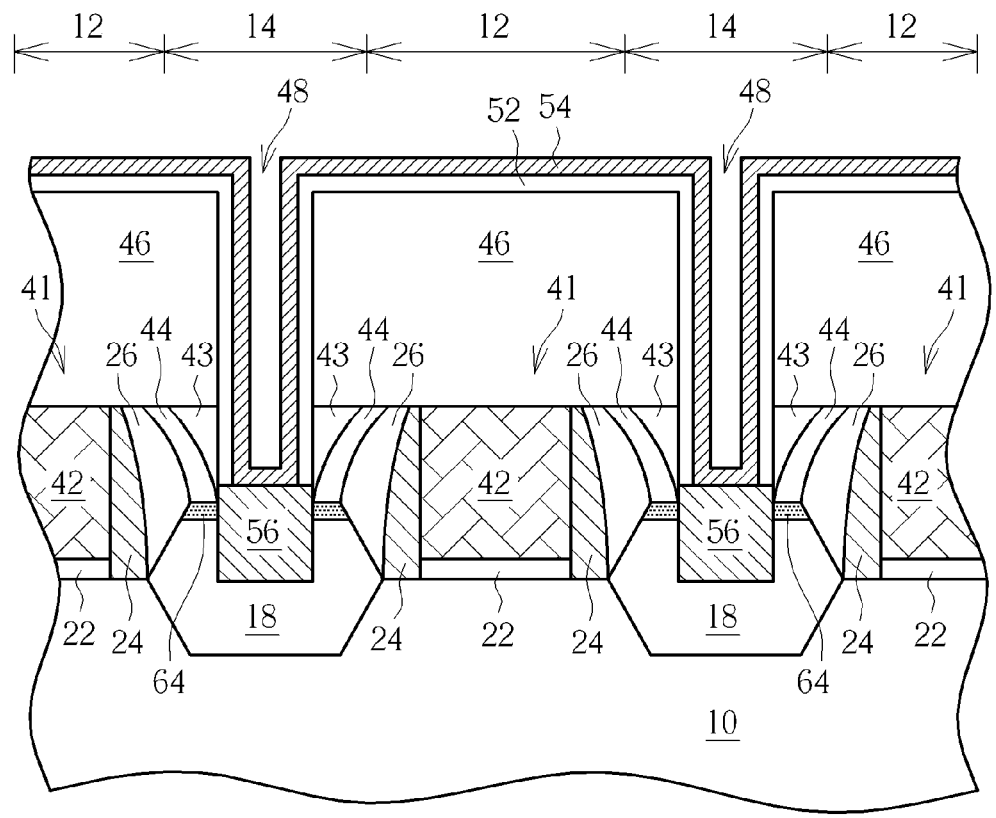
FIG. 12 is a schematic, cross-sectional diagram showing a structure where a metal silicide layer is formed inside each contact hole according to the second preferred embodiment of the present invention.

Please refer to FIG. 12 accompanied with FIG. 9. FIG. 12 is a schematic, cross-sectional diagram after step 208, which shows a structure where a conductive contact is formed inside a contact hole according to the first preferred embodiment of the present invention. Similar to the structure shown in FIG. 6, through proper processes, like a deposition and a anneal processes, a metal silicide layer 56, like nickel silicide (NiSi) maybe formed inside the epitaxial layer 18. One difference between the structures respectively shown in FIG. 12 and FIG. 6 is that no fluorine-containing layer is under the metal silicide layer 56 because the fluorine-containing layer in FIG. 12 may be exposed and removed during forming contact holes 48 and/or incorporated into the metal salicide layer 56. That is to say, a portion of the fluorine-containing layer may be removed completely or locate inside the metal silicide layer 56 and a portion of the fluorine-containing layer 64 will be disposed on a periphery of the metal silicide layer. That is to say, the fluorine-containing layer 64 may surround the sides of the metal silicide layer 56 according to this embodiment. However, similar to the structure shown in FIG. 7, there may be no fluorine-containing layer exists on one side of the metal silicide layer. In the following processes, step 210 is further carried out to form a conductive contact (not shown) inside each contact hole 48 so that a semiconductor device similar to that shown in FIG. 8 is obtained. Since these processes are similar to those described in the first preferred embodiment, for the sake of brevity, the description of which are therefore omitted.

Figure 13:
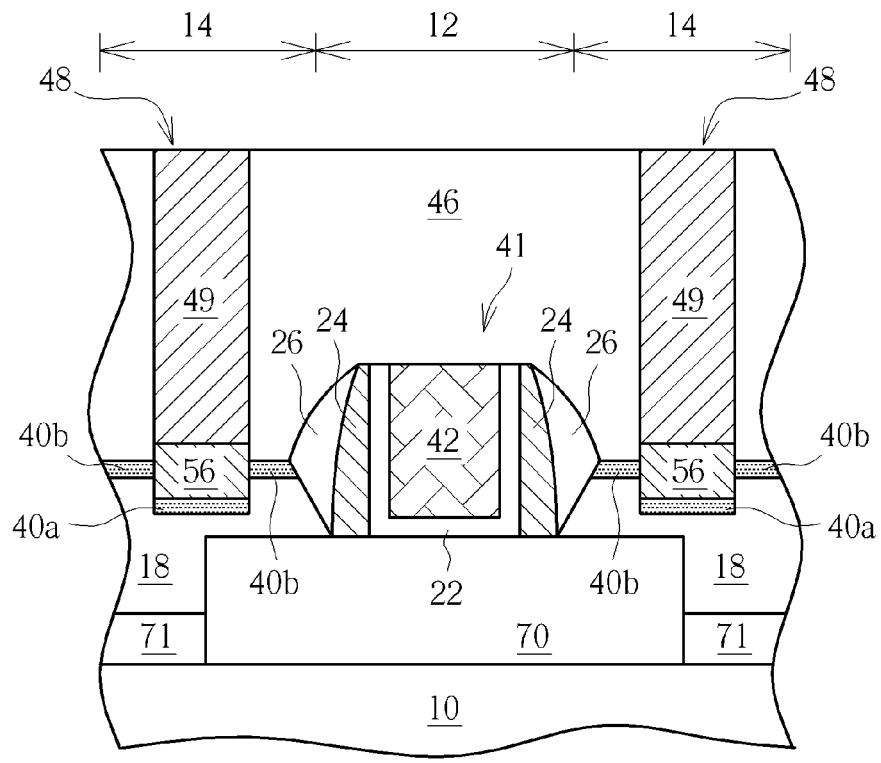
FIG. 13 is a schematic, cross-sectional diagram showing a semiconductor device having a Fin-FET structure according to a third preferred embodiment of the present invention.

Please refer to FIG. 13. FIG. 13 is a schematic, cross-sectional diagram showing a semiconductor device having a Fin-FET structure according to a third preferred embodiment of the present invention. In FIG. 13, a fluorine-containing layer 40a and 40b is also formed in each epitaxial layer 18, such as SiGe, SiP and so forth. However, one main difference between this embodiment and each above-mentioned embodiment is that a semiconductor device according to the third preferred embodiment has a Fin-FET structure. To put it more concretely, a semiconductor substrate 10 also has a gate region 12 and at least a source/drain region. A metal gate structure 41, epitaxial layers 18 and a fin-shaped semiconductor body 70 are disposed on the semiconductor substrate 10. An insulating layer 71 may be further disposed between the epitaxial layers 18 and the semiconductor substrate 10. The metal gate structure 41 includes a metal layer 42, an U-shaped dielectric layer 22, a first spacer 24 and a second spacer 26, but is not limited to this. An ILD 46 having a plurality of contact holes 48 covers the metal gate structure 41 and the epitaxial layers 18. And each contact hole 48 is filled up with a conductive contact 49 and may have an elliptical shape, a bar shape or a circular shape. It is worth noting that, similar to the structure shown in FIG. 8 and FIG. 12, a fluorine-containing layer 40a and 40b is disposed in each epitaxial layer 18. As shown in FIG. 13, the fluorine-containing layer 40a is disposed under the metal silicide layer 56 and the fluorine-containing layer 40b is able to on a periphery of the metal silicide layer 56. That is to say, the fluorine-containing layer 64 may surround the sides of the metal silicide layer 56 according to this embodiment. However, similar to the structure shown in FIG. 7, there may be no fluorine-containing layer exists on one side of the metal silicide layer. A portion of the fluorine-containing layer maybe inside the metal silicide layer if required. Similarly, due to the existence of the fluorine-containing layer 40a and 40b, metal elements inside the metal silicide layer 56 will no longer laterally diffuse into a channel region. As a result, the piping defects occurring in the conventional semiconductor devices will not present. In addition, if a portion of the fluorine-containing layer 40a is etched away during the formation of the contact hole 48, there may be only the fluorine-containing layer 40b around the sides of the metal silicide layer 56 and no fluorine-containing layer 40a under the metal silicide layer 56.

Similarly, according to other embodiments of the present invention, the two-layered spacer (i.e. the first spacer 24 and the second spacer 26) in the Fin-FET structure may be replaced with a single-layered spacer or multi-layered spacer in order to meet specific product requirements. Besides, the spacer may be or may not be in contact with the epitaxial layer. Furthermore, the epitaxial layer may be in any proper shape and may comprise suitable composition (such as Si, SiGe, SiP or the like) in either NMOS region or PMOS region. As shown in FIG. 13, although there is only one stripe of metal gate structure 41 crossing over a fin-shaped semiconductor body 70, optionally, there may be more than one stripe of metal gate structure crossing over each fin-shaped semiconductor body according to another embodiment of the present invention. For example, there may be two metal gate structures crossing over one fin-shaped semiconductor body. In this case, the epitaxial layers may locate between the two adjacent metal gate structures or at each end of the fin-shaped semiconductor body.

To summarize, the present invention provide a method of manufacturing a semiconductor device. By forming the fluorine-containing layer on the surface of the epitaxial layer, the fluorine-containing layer may thereby enclose the sides of the metal silicide layer and/or under the metal silicide layer. Consequently, metallic atoms in the metal silicide layer near the bottom of the contact holes are no longer able to laterally diffuse into the channel region under the gate structure or the metal gate structure. As a result, piping defects or spike defects occurring in the conventional semiconductor devices can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:

providing a semiconductor substrate having at least a gate region and at least a source/drain region adjoining the gate region;

forming at least an epitaxial layer on the semiconductor substrate within the source/drain region;

forming a fluorine-containing layer on a surface of the epitaxial layer, whereby a top surface of the gate structure is not covered by the fluorine-containing layer during the step of forming the fluorine-containing layer;

forming a metal gate structure within the gate region after the step of forming the fluorine-containing layer;

forming an interlayer dielectric to cover the semiconductor substrate, the epitaxial layer and the metal gate structure;

forming at least a contact hole penetrating the interlayer dielectric to expose a portion of the epitaxial layer; and forming at least a metal silicide layer on or in the epitaxial layer on a bottom of the contact hole, wherein the fluorine-containing layer is disposed on a periphery of the metal silicide layer after the step of forming the metal silicide layer.

2. The method according to claim 1, wherein the step of forming a fluorine-containing layer comprises a fluorine ion implantation process.

3. The method according to claim 1, wherein the step of forming the fluorine-containing layer comprises:

forming an oxide film conformally covering the epitaxial layer; and performing an etching process to remove the oxide film, wherein an etchant of the etching process comprises a fluorine-containing molecule.

4. The method according to claim 3, wherein the oxide film is completely or partially removed through the etching process.

5. The method according to claim 1, wherein the fluorine-containing layer is further located under a bottom of the metal silicide layer.

6. The method according to claim 1, wherein a position of the fluorine-containing layer disposed on the periphery of the metal silicide layer is higher than a position of the fluorine-containing layer located under a bottom of the metal silicide layer.

7. The method according to claim 1, wherein the metal gate structure further comprises a metal gate and at least a spacer disposed on a sidewall of the metal gate.

8. The method according to claim 7, wherein the spacer has a single-layered structure or a multi-layered structure.

9. The method according to claim 1, wherein the epitaxial layer comprises silicon germanium, silicon phosphorous, silicon carbon or phosphorus-doped silicon carbon.

10. The method according to claim 1, wherein the metal silicide layer comprises nickel silicide, nickel platinum silicide, platinum silicide, cobalt silicide or tungsten silicide.

11. The method according to claim 1, wherein the contact hole has an elliptical shape, a bar shape or a circular shape.

12. The method according to claim 1, wherein the semiconductor device is a fin field effect transistor.

13. The method according to claim 1, wherein the fluorine-containing layer encloses sides of the metal silicide layer.

14. The method according to claim 1, further comprising depositing an etch stop film disposed on the fluorine-containing layer.

\* \* \* \* \*